(12) United States Patent
Misium et al.

(10) Patent No.: US 6,261,973 B1
(45) Date of Patent: *Jul. 17, 2001

(54) REMOTE PLASMA NITRIDATION TO ALLOW SELECTIVELY ETCHING OF OXIDE

(75) Inventors: George R. Misium, Plano; Sunil V. Hattangady, McKinney, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,477

(22) Filed: Dec. 18, 1998

Related U.S. Application Data

(60) Provisional application No. 60/070,219, filed on Dec. 31, 1997, provisional application No. 60/070,255, filed on Dec. 31, 1997, and provisional application No. 60/070,148, filed on Dec. 31, 1997.

(51) Int. Cl.$^7$ ................................................. H01L 21/469
(52) U.S. Cl. ........................................... 438/775; 438/788
(58) Field of Search ..................................... 438/301, 305, 438/766, 769, 787, 788, 792, 202, 231, 234, 303, 775

(56) References Cited

U.S. PATENT DOCUMENTS

| | | | |
|---|---|---|---|
| 4,217,599 | * | 8/1980 | Sato et al. ............................... 357/23 |
| 4,774,197 | * | 9/1988 | Haddad et al. .......................... 437/27 |
| 5,071,780 | * | 12/1991 | Tsai ...................................... 438/303 |
| 5,316,965 | * | 5/1994 | Philipossian et al. ............... 438/424 |
| 5,726,087 | * | 3/1998 | Tseng et al. .......................... 438/261 |
| 5,861,347 | * | 1/1999 | Miaiti et al. .......................... 438/787 |
| 5,869,149 | * | 2/1999 | Denison et al. ...................... 427/579 |
| 6,040,249 | * | 3/2000 | Holloway .............................. 438/769 |

* cited by examiner

*Primary Examiner*—David Nelms
*Assistant Examiner*—David Nhu
(74) *Attorney, Agent, or Firm*—Jacqueline J. Garner; W. James Brady, III; Frederick J. Telecky, Jr.

(57) ABSTRACT

A method is disclosed of nitridating an oxide containing surface the disclosed method includes the steps of, obtaining a substrate, growing an oxide layer on the substrate, exposing the surface of the oxide layer to a nitrogen ion containing plasma at, e.g., room temperature, wherein the nitrogen ions form a nitrided layer on the oxide layer resistant to chemistries used to etch oxide.

21 Claims, 3 Drawing Sheets

US 6,261,973 B1

REMOTE PLASMA NITRIDATION TO ALLOW SELECTIVELY ETCHING OF OXIDE

This application claims priority under 35 USC § 119 (e) (1) of provisional application no. 60/070,219, filed Dec. 31, 1997; provisional application no. 60/070,255, filed Dec. 31, 1997; and provisional application no. 60/070,148, filed Dec. 31, 1997.

TECHNICAL FIELD OF THE INVENTION

The present invention relates in general to the field of integrated circuit manufacturing, and more particularly, to the formation of a thin film of nitride by using a nitrogen plasma to allow selective etching of layers during the formation of integrated circuit components.

DESCRIPTION OF THE RELATED ART

Without limiting the scope of the invention, its background is described in connection with the manufacture and formation of integrated circuit components for use in the creation of metal oxide semiconductors, as an example.

Heretofore, in this field, the major steps in silicon wafer fabrication have been the use of diffusion, metallization, etching and chemical clean-up steps to form semiconductors. The introduction of thermal oxidation of silicon, the use of lithographic photoresist techniques and etching of the various components using specific and non-specific chemical agents brought forth the era of the planar processing of semiconductor integrated circuits.

More recently, complementary metal oxide silicon devices (CMOS) have been formed by the growth, deposition and etching of conductive and non-conductive layers taking advantage of chemical-vapor deposition (CVD) and ion implantation techniques. Chemical vapor deposition allowed for the selective and non-selective deposition of, e.g., etch protective overcoats, and of masking material.

In addition to CVD, other common ways for the deposition of conducting or insulation thin films has been the use of vacuum deposition or sputtering. Vacuum deposition and sputtering coat the wafer with a thin film which can, e.g., form an inorganic insulating material when heated in a reactive atmosphere. All three techniques can be used to achieve the deposition of a conducting or insulating layer. The deposited layers may also be used as sacrificial layers for use in the selective etching and formation of an integrated circuit component.

SUMMARY OF THE INVENTION

It has been found, however, that present methods for integrated circuit design and manufacture using silicon nitride layers account for a significant portion of the thermal budget during wafer processing. The thermal budget must be lowered to, e.g., enable scaling of high density integrated circuits. In addition, the large number of high temperature processing steps cause a significant impact on energy consumption and environmental impact of the current methods. The use of large amounts of chemical etching agents to remove these sacrificial layers can contribute to device failure (due, e.g., to mobile ions in the etching agents).

Furthermore, the deposition of thick silicon nitride layers can be required when deep etching of surrounding area is to be accomplished. Due to the thermal expansion of the layer during high temperature steps, mechanical stress resulting from the thick silicon nitride layer can lead to device failure.

What is needed is an improved method for the formation of a nitride layer, but that does not require a high temperature deposition step. Also, a need has arisen for a nitride layer that can be selectively deposited without affecting a photoresist layer. The layer, however, should preferably still be an effective barrier against mobile ions, and be easily removed in subsequent steps when used as a sacrificial layer.

The present invention provides an improved method for creating a silicon nitride layer, or nitrided layer, which is resistant to oxide etching agents but does not require a high temperature deposition step. Using the present invention a nitrided layer can be selectively deposited without affecting a photoresist layer. The method of the present invention can also allow for the deposition of a thin layer that lessens the mechanical stress caused within the layer at high temperatures. The nitride layer of the present invention can provide an effective barrier against mobile ions, and can be easily removed during subsequent steps when used as, e.g., a sacrificial layer.

More particularly, the present invention is directed to a method of nitriding an oxide containing surface comprising the steps of, obtaining an oxide containing surface and exposing the oxide containing surface to a nitrogen ion containing plasma, wherein the nitrogen ions form a nitride layer on the oxide containing surface.

In one embodiment, a low temperature method of nitriding an oxide containing surface comprises the steps of, obtaining a substrate, growing an oxide layer on the substrate, said oxide layer having a surface and exposing the oxide containing surface to a nitrogen ion containing plasma, wherein the nitrogen ions form a nitrided layer on the oxide containing surface that can be used to protect layers underneath the nitrided layer from, for example, selective etching agents.

More particularly, the oxide containing surface can be further defined as a silicon oxide layer, the oxide containing surface being at a temperature below 600 degrees Celsius, and in one embodiment the temperature is room temperature. The nitrogen ion plasma can be created by a remote plasma.

The method of the present invention may further comprising the step of lithographically developing a resist layer on the oxide containing surface prior to exposing the oxide containing surface to a nitrogen ion containing plasma. Alternatively, one can lithographically develop a resist layer on the oxide containing surface after exposing the oxide containing surface to a nitrogen ion containing plasma.

The step of exposing the oxide containing surface to a nitrogen ion containing plasma can be further defined as occurring at between about 4 and 12 mTorr, and in one embodiment may be, for example, at about 4 mTorr. The step of exposing the oxide containing surface to a nitrogen ion containing plasma can also be defined as occurring for between about 10 to 90 seconds, in one embodiment the exposure occurring for about 60 seconds. In yet another embodiment, the oxide containing surface can be exposed to a nitrogen ion containing plasma at between about 1000 and 3000 watts. In one embodiment the nitrogen ion containing plasma can be created at about 2000 watts. In yet another embodiment, the rate of formation of the nitrided oxide layer is dependent on a substrate bias, where the rate of nitrogen ion implantation into the silicon substrate depends on the voltage difference between the substrate and the plasma.

BRIEF DESCRIPTION OF THE DRAWINGS

For a more complete understanding of the features and advantages of the present invention, reference is now made

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is directed to a process for rendering a silicon dioxide layer resistant to etch chemistries used in integrated circuit component manufacturing, such as, hydrofluoric acid (HF). Remote plasma nitridation is used to selectively nitridate or nitridize a small layer of a silicon dioxide layer. The remote plasma nitridation may form, in situ, a "silicon nitride" which is to be understood as including a heterogeneous mixture of silicon nitride ($Si_3N_4$) and silicon oxynitride ($SiNO_x$).

To prevent the nitridation by remote plasma deposition over specific locations on a silicon dioxide layer, a layer of lithographically developed photoresist can be placed over the silicon dioxide prior to nitridation to cover portions of the silicon dioxide. The photoresist prevents the interaction between the nitrogen ions created in the remote plasma and the silicon dioxide covered by the photoresist.

An alternative option is use remote plasma nitridation to cover the surface of the silicon dioxide layer with a nitrided layer prior to the application of a lithographic photoresist layer. The photoresist then serves as a masking layer to protect portions of the nitridized areas during a nitride removal etch.

Figure 1A:
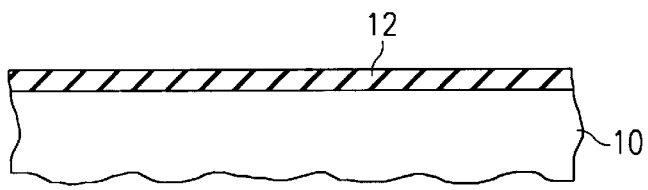
FIGS. 1a–c are illustrative cross-sections of one embodiment of the method of the present invention.
Figure 1B:
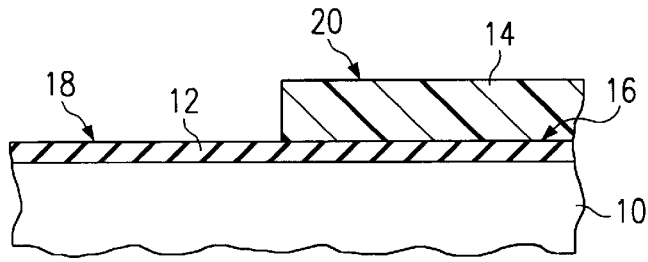
Figure 1C:
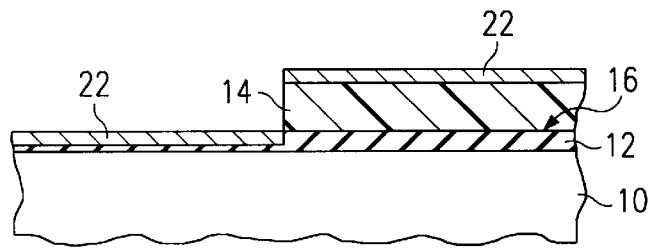

The general features of the method for rendering silicon dioxide resistant to HF chemistries by the remote plasma nitridation of the present invention are shown in FIGS. 1a–c. A portion of a wafer 10 on which a silicon dioxide layer 12 has been formed is illustrated FIG. 1a. The wafer 10 is typically a single crystal silicon substrate. The silicon dioxide layer 12 is grown over the wafer 10 by a high temperature processing step in an oxidizing environment.

Next, as shown in FIG. 1b, a photoresist layer 14 is shown patterned on a portion of the surface 16 that will not be exposed to the remote plasma nitrogen ions. The surface 18 of the silicon dioxide layer 12 and the top surface 20 of the photoresist layer 14 are then exposed, as shown in FIG. 1c, to a nitriding atmosphere created in a remote plasma nitridation chamber (not shown), causing the surface of the silicon dioxide layer 12 to be nitrided. In subsequent processing steps, the photoresist layer 14 can be removed and further processing of the oxide surface 16 or the nitrided layer surface 22 can follow.

Figure 2A:
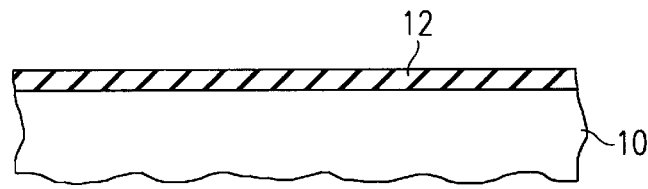
FIGS. 2a–c are illustrative cross-sections of another embodiment of the method of the present invention.
Figure 2B:
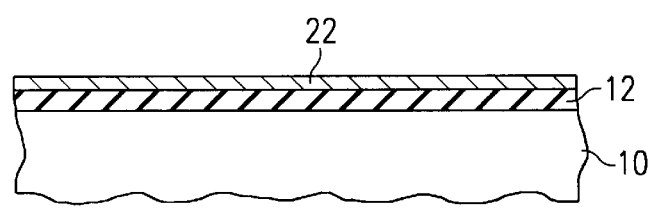
Figure 2C:
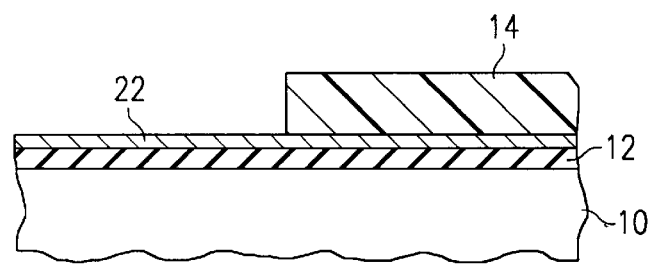

An alternative method for rendering silicon dioxide resistant to HF chemistries by the remote plasma nitridation is shown in FIGS. 2a–c. As in FIG. 1a, FIG. 2a shows a portion of a wafer 10 on which a silicon dioxide layer 12 has been grown.

A nitrided layer 22 is created on the entire surface of the silicon dioxide layer 12 as shown in FIG. 2b. Next, a photoresist layer 14 is patterned to cover a portion of the nitrided layer 22 as shown in FIG. 2c. Next, etching chemicals that are capable of etching nitrided portions of the oxide, (but that do not completely affect the photoresist layer 14), are applied to remove the exposed portion of the nitrided layer 22 over the silicon dioxide layer 12. When the photoresist layer 14 is removed, the portion of the nitrided layer 22 that was under the photoresist layer 14 still contains the nitrided surface that is resistant to HF chemistry etchants, while the exposed portion of the nitrided layer 22 was etched away, leaving bare oxide.

Figure 3A:
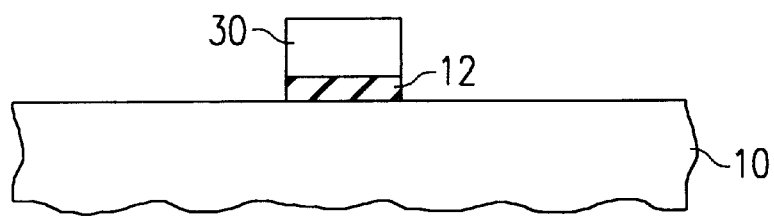
FIG. 3a–c are illustrative cross-sections of another embodiment of the method of the present invention.
Figure 3B:
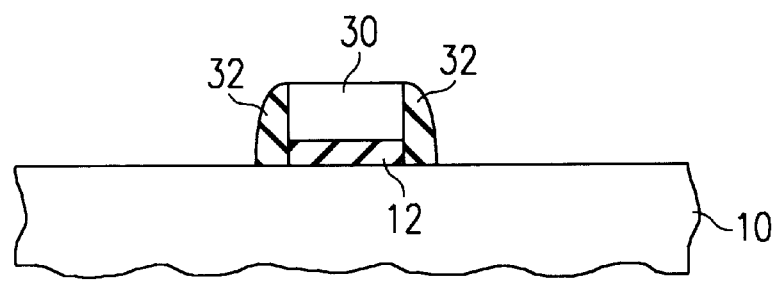
Figure 3C:
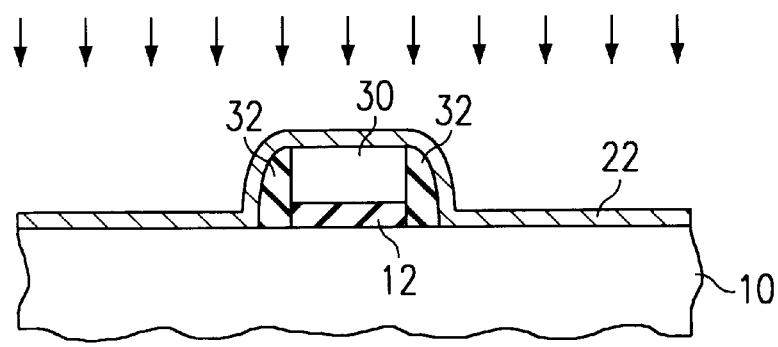
Figure 4:
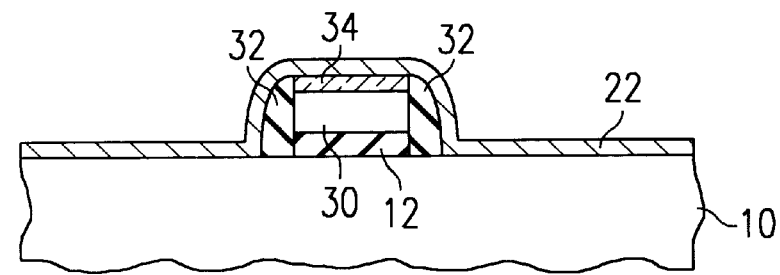
FIG. 4 is an illustrative cross-section of another embodiment of the method of the present invention.

FIG. 3A shows a silicon wafer 10 on which a silicon dioxide layer 12 and a polysilicon layer 30 has been deposited to form a gate oxide and a gate, respectively. The gate can be patterned and etched for use as, e.g., a transistor gate. Next, a silicon oxide layer is blanket deposited and etched back to form silicon dioxide sidewalls 32, as shown in FIG. 3B. FIG. 3C shows the structure formed by exposing the wafer 10 to RPN. The nitridation creates a nitrided layer 22 thereby creating, e.g., an etch stop layer for use in subsequent manufacturing steps. At the same time, the structure in FIG. 3C has silicon dioxide sidewalls 32 that are protected from subsequent etching step. Unlike prior art processes that involve the creation of silicon nitride layers of silicon nitride sidewalls, the present invention allows for the formation of silicon oxide sidewalls 32 that can be protected from subsequent etching steps by nitrided layer 22. FIG. 4 shows another embodiment of the invention in which a silicide layer 34 has been deposited on the polysilicon layer 30, that in this example forms a gate. The silicide layer 34 can be, for example, titanium, tungsten, cobalt or nickel and may be used to dope the polysilicon layer 30 with either a P-type or an N-type dopant.

The nitrided layer 22 is formed at a low temperature, which is generally described herein as less than 600 degrees Celsius. The thickness of the nitrided layer 22 can be varied by increasing the substrate bias on the wafer 10 during the silicon dioxide nitridation process, thereby allowing for the creation of a thicker or thinner nitrided layer 22. The thickness of the nitrided layer 22 can also be varied by increasing the length of the exposure to the nitrogen ion remote plasma. A combination of substrate bias and time can be adjusted to meet the demands of the manufacturing requirements of different circuits as will be known to those of skill in the art in light of the present disclosure.

Figure 5A:
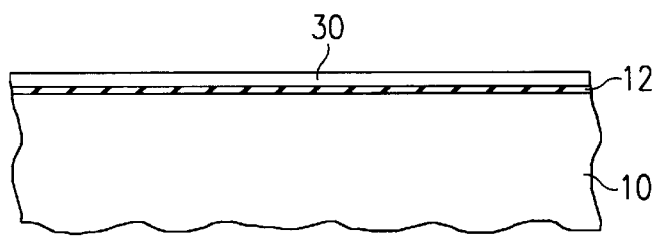
FIG. 5a–f are illustrative cross-sections of another embodiment of the present invention.
Figure 5B:
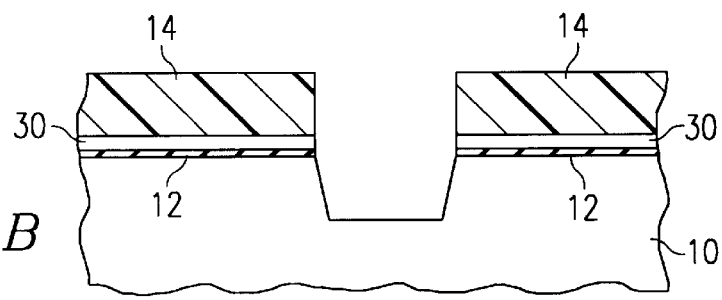
Figure 5C:
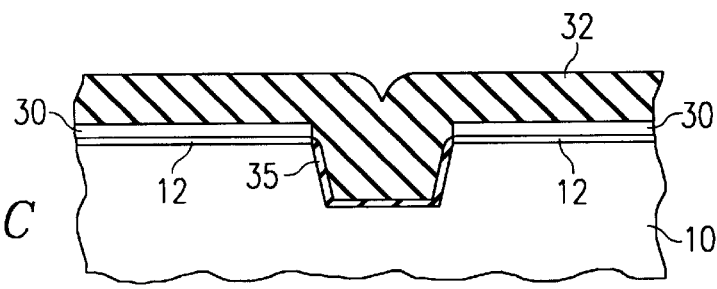
Figure 5D:
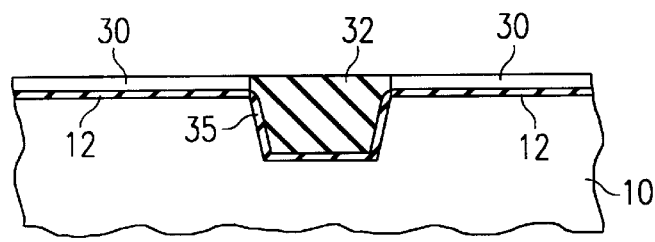

FIG. 5a shows the starting layers for a shallow trench isolation, including a wafer 10 a silicon dioxide layer 12 and a nitride layer 30 (which nitride layer is preferably formed by a remote plasma nitridation). In FIG. 5b a photoresist layer 14 has been patterned on the nitride layer 30 and then etched to form opening 34, which traverses nitride layer 30, silicon dioxide layer 12 and has partially etched into wafer 10 to form a trench. In FIG. 5c, the photoresist 14 has been removed, the wafer 10 cleaned, the wafer oxidized to form a trench liner oxide 35, and the opening 34 filled by depositing or blanket coating the wafer 10 with a silicon dioxide trench layer 32, as will be known to those of skill in the art. The wafer 10 is then planarized by, for example, chemical-mechanical polishing and the resulting wafer 10, as depicted in FIG. 5d, is exposed to a remote nitrogen plasma to form a nitrided layer 22 in the silicon dioxide trench 32 and the nitride layer 30.

The use of the nitrogen plasma to form nitrided layer 22 simultaneously achieves the advantages that the trench dimensions are kept relatively constant and stress minimized (both due to the low temperature nature of the remote plasma nitridation method and the relatively thin nitride oxide coating). The fact that the top surface of the trench remains substantially planar, is a significant advantage in subsequent processing.

Figure 5E:
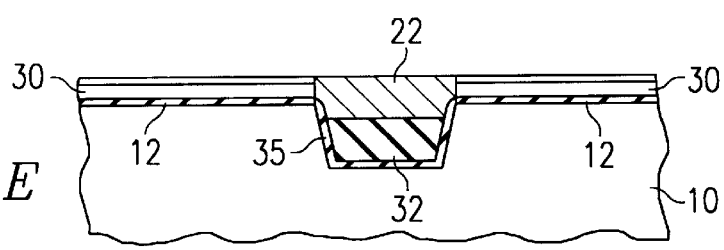
Figure 5F:
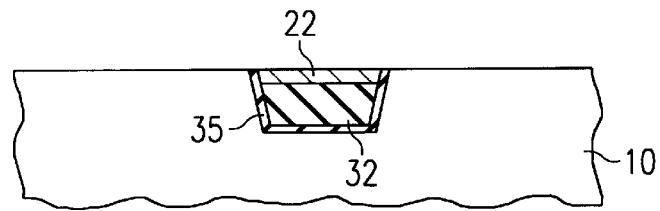

The resulting structure is depicted in FIG. 5e. An etching step may be used in which a portion of the nitrided layer 22, nitride layer 30, silicon dioxide layer 12 are removed and FIG. 5f shows such a structure of the trench isolation after removal of the sacrificial layers, and in which the silicon dioxide trench 32 is still protected by a nitride layer 22 for use in subsequent processing steps. By using a thin nitrided layer 22 over the silicon dioxide trench 32, the structure and method of the present invention reduces the possibility of cracking of the nitride layer, as would occur if a thick nitride layer were deposited at high temperature, as is done in the prior art. The nitrided layer 22 also protects the underlying silicon in the trench from oxidation in subsequent processing requiring a high temperature step in an oxidizing environment, again substantially maintaining planarity and substantially avoiding stresses.

To etch the silicon dioxide layers, HF in various dilutions in water and often buffered with ammonium fluoride can be used. Silicon is etched in HF at a minuscule rate and thus provides an etch stop after an overlying oxide layer is etched. When using HF etchants the etching rate increases and decreases with etchant concentration. Increasing the temperature also increases the etch rate, with buffered solutions containing the etchants having a slightly higher activation energy.

Silicon nitride can be wet etched with either HF solutions or with hot phosphoric acid. Phosphoric acid is the "standard" wet nitride etch. In it, the nitride can etch more than 40 times as fast as CVD oxide, which is often used as a mask. The selectivity decreases at high temperatures, but in order to have useful etch rates, high-temperature boiling concentrated $H_3PO_4$ generally are used. For example, 91.5% $H_3PO_4$ boils at 180 degrees C., etches high-temperature nitride at approximately 100 Angstroms/minute, and etches CVD oxide at about 10 Angstroms/minute. Under these same conditions, sing-lecrystal silicon etches about 30% as fast as CVD oxide. The remote plasma nitridation used in the invention can be carried out as follows. Nitridation can be performed at, for example, room-temperature by exposing a gate oxide to a short, high-density, remote helicon-based nitrogen discharge. Process conditions for the nitridation can be, for example, a process pressure of 2.7 to 12 mTorr, an input plasma power of 500 to 3000 W, and a durations of 3 to 90 s. In one embodiment of the present invention, a high density plasma discharge from a helicon-based nitrogen discharge is created using a plasma power of 1000 to 3000 watts. A power of 2000 watts can also be used. The chamber pressure can also be from 4 to 12 mTorr. Finally, a nitridation exposure time can be from about 10 to 90 seconds. In one embodiment, the nitridation exposure time was 20 seconds. The wafer can be supported on a ceramic ring (electrically floating) or, alternatively, on an electrostatic chuck (capacitively coupled to ground). The wafer 10 can be biased during plasma exposure to increase the depth of nitrogen in the silicon oxide layer 12. The bias increases the energy of the striking ions. An increase in the thickness of the nitrided layer is useful for applications requiring a thicker nitrided layer.

Post-nitridation annealing in an inert or low partial-pressure oxygen ambient can be performed using a furnace or rapid-thermal annealing. In one embodiment, the post-nitridation anneal is conducted in a controlled environment having, e.g., $N_2$, in an ambient or dilute ambient oxidation environment. Next, a rapid thermal anneal at 1000 degrees Centigrade for 60 seconds is conducted.

Depth profiling analysis can be performed on nitrided oxides with or without a 10 nm a-Silicon dioxide cap layer. Dynamic SIMS analysis can be performed using 1 keV Cs primary ion bombardment. Monitoring of CsSi+, CsO+, and CsN+ ions can be conducted to track [SI], [N] concentrations, respectively. Separately, Time-of-flight SIMS (TOFSIMS), analysis can be performed using a 2 keV Ga+ primary ion bombardment, achieving 0.5–0.7 nm depth resolution within the top 5 nm of the dielectric film. Gallium, for example, can be selected as a primary ion source to minimize the pre-equilibrium effect nominally associated with Cs+ and O+ ion sources, allowing meaningful analysis of N and O concentrations from the top five angstroms. $Si_xN+$ and $Si_xO+$ ions can be used to track [N] and [O] as a function of depth.

The nitrided layer 22 is created at a low temperature, which is generally described herein as less than 500 degrees Celsius. The thickness of the nitrided layer 22 can be varied by increasing the substrate bias on the wafer 10 during the silicon dioxide nitridation process, thereby allowing for the creation of a thicker or thinner nitrided layer 22. The thickness of the nitrided layer 22 can also be varied by increasing the length of the exposure to the nitrogen ion remote plasma. A combination of substrate bias and time can be adjusted to meet the demands of the manufacturing requirements of different circuits as will be known to those of skill in the art in light of the present disclosure.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit structure, comprising the steps of:

forming an oxide layer at a semiconductor surface of a substrate;

patterning a mask layer comprised of photoresist over portions of the oxide layer, leaving selected portions of the oxide layer unmasked; and exposing the unmasked portions of the oxide layer to a plasma containing nitrogen ions, to form a nitrided layer at the surface of the unmasked portions of the oxide layer.

2. The method of claim 1, wherein said oxide layer is a silicon oxide;

and wherein the exposing step is performed at a temperature below 600 degrees Celsius.

3. The method of claim 2, wherein said temperature is room temperature.

4. The method of claim 1, wherein said plasma is created remotely from the location of the oxide layer.

5. The method of claim 1, wherein said exposing step is performed at a pressure of between about 4 and 12 mTorr.

6. The method of claim 5, wherein said exposing step is performed at a pressure of at about 4 mTorr.

7. The method of claim 1, wherein said exposing step is performed for a duration of between about 10 to 90 seconds.

8. The method of claim 1, wherein said exposing step is performed for a duration of about 60 seconds.

9. The method of claim 1, wherein said plasma is generated at a power of between about 1000 and 3000 watts.

10. The method of claim 1, wherein said plasma is generated at a power of about 2000 watts.

11. A method of fabricating an integrated circuit structure, comprising the steps of:

growing an oxide layer on a semiconducting surface of a substrate;

exposing the oxide layer to a plasma containing nitrogen ions to form a nitrided layer at a surface of the oxide layer; and then patterning a mask layer comprised of photoresist over selected portions of the nitrided oxide layer, leaving remaining portions of the nitrided oxide layer unmasked; and etching the unmasked remaining portions of the nitrided oxide layer.

12. The method of claim 11, wherein said oxide layer is a silicon oxide;

and wherein the exposing step is performed at a temperature below 600 degrees Celsius.

13. The method of claim 12, wherein said temperature is room temperature.

14. The method of claim 11, wherein said plasma is created remotely from the location of the oxide layer.

15. The method of claim 11, wherein said exposing step is performed at a pressure of between about 4 and 12 mTorr.

16. The method of claim 15, wherein said exposing step is performed at a pressure of at about 4 mTorr.

17. The method of claim 11, wherein said exposing step is performed for a duration of between about 10 to 90 seconds.

18. The method of claim 11, wherein said exposing step is performed for a duration of about 60 seconds.

19. The method of claim 11, wherein said plasma is generated at a power of between about 1000 and 3000 watts.

20. The method of claim 19, wherein said plasma is generated at a power of about 2000 watts.

21. The method of claim 11, further comprising:

during the exposing step, applying a substrate bias to the substrate in order to increase the rate of formation of said nitrided layer.

* * * * *